United States Patent [19]
Liu et al.

[11] Patent Number: 6,037,233
[45] Date of Patent: Mar. 14, 2000

[54] METAL-ENCAPSULATED POLYSILICON GATE AND INTERCONNECT

[75] Inventors: Yauh-Ching Liu, Sunnyvale; Gary K. Giust, Cupertino; Ruggero Castagnetti, San Jose; Subramanian Ramesh, Cupertino, all of Calif.

[73] Assignee: LSI Logic Corporation, Milpitas, Calif.

[21] Appl. No.: 09/069,027

[22] Filed: Apr. 27, 1998

[51] Int. Cl.[7] .................................................. H01L 21/336
[52] U.S. Cl. ........................ 438/304; 438/580; 438/582; 438/585; 438/592; 438/596; 438/669; 438/674; 438/685; 438/688
[58] Field of Search ................................. 438/582, 580, 438/585, 592, 596, 669, 674, 688, 685, 304

[56] References Cited

U.S. PATENT DOCUMENTS

| | | | |
|---|---|---|---|
| 4,263,058 | 4/1981 | Brown et al. | 148/6 |
| 5,132,756 | 7/1992 | Matsuda | 357/23.1 |
| 5,162,884 | 11/1992 | Liou et al. | 257/384 |
| 5,183,771 | 2/1993 | Mitsui et al. | 437/44 |
| 5,227,320 | 7/1993 | Johnson et al. | 437/44 |
| 5,231,042 | 7/1993 | Ilderem et al. | 437/44 |
| 5,256,585 | 10/1993 | Bae | 437/44 |
| 5,290,720 | 3/1994 | Chen | 437/41 |
| 5,306,951 | 4/1994 | Lee et al. | 257/755 |
| 5,341,028 | 8/1994 | Yamaguchi et al. | 257/344 |
| 5,397,722 | 3/1995 | Bashir et al. | 437/41 |
| 5,397,909 | 3/1995 | Moslehi | 257/383 |
| 5,444,024 | 8/1995 | Anjum et al. | 437/200 |
| 5,473,184 | 12/1995 | Murai | 257/382 |
| 5,565,383 | 10/1996 | Sakai | 437/200 |
| 5,565,703 | 10/1996 | Chang | 257/530 |
| 5,580,806 | 12/1996 | Chang et al. | 437/44 |
| 5,658,807 | 8/1997 | Manning | 438/158 |
| 5,723,893 | 3/1998 | Yu et al. | 257/413 |
| 5,739,052 | 4/1998 | Krishman et al. | 438/17 |
| 5,739,573 | 4/1998 | Kawaguchi | 257/384 |

OTHER PUBLICATIONS

Yauh–Ching Liu, Gary K. Giust, Ruggero Castagnetti, and Subramanian Ramesh, "*Silicide Encapsulation of Polysilicon Gate and Interconnect*", Application Serial No: 08/995,875, Filing Date Dec. 22, 1997, Claims from corresponding U.S. Patent application (Atty Dkt: LS11P106).

Wolf, et al. "Silicon Processing for the VLSI Era", *Process Technology*, vol. 1, pp. 397–399 (1985).

Lee, et al. "A Selective CVD Tungsten Local Interconnect Technology" *IEEE*, pp. 450–453 (1988).

Wei, et al. "The Use of Selective Electroless Metal Deposition for Micron Size Contact Fill" *IEEE* pp. 446–449 (1988).

Amazawa, et al. "Selective Growth of Aluminum Using a Novel CVD System" *IEEE*, pp. 442–445 (1988).

Green, et al. "Structure of Selective Low Pressure Chemically Vapor–Deposited Films of Tungsten" *Journal of Electrochemical Society*, vol. 132, No. 5, pp. 1243–1250 (1985).

Nishiyama, et al. "Two Step Tungsten Selective CVD for High Speed CMOS Device Applications" VLSI Research Center at Toshiba Corporation, Japan, pp. 97–98 (date unknown).

Blewer, et al. "Thick Tungsten Films in Multilayer Conductor Systems" *IEEE*, pp. 153–158 (1984).

*Primary Examiner*—Wael Fahmy
*Assistant Examiner*—Long Pham
*Attorney, Agent, or Firm*—Beyer & Weaver

[57] ABSTRACT

Provided are methods of forming a metal layer on the horizontal and vertical surfaces of a polysilicon gate electrode/interconnect in a MOS transistor, and devices having metal-encapsulated gates and interconnects. The metal encapsulation method of the present invention may also provide a layer of metal on the exposed surfaces of the source and drain regions of the transistor. The methods and apparatuses of the present invention allow reductions in device resistance and signal propagation delays.

13 Claims, 2 Drawing Sheets

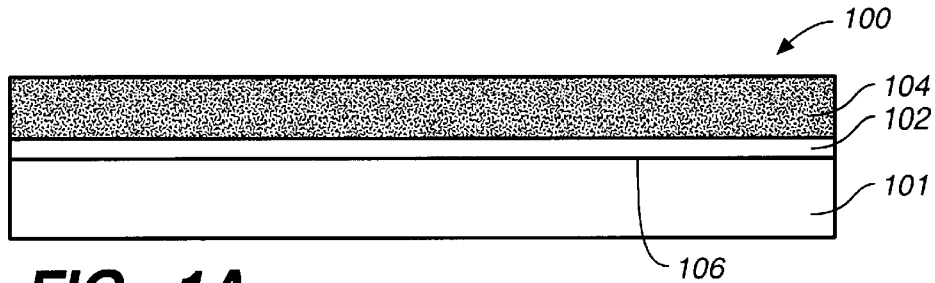
FIG._1A
(PRIOR ART)
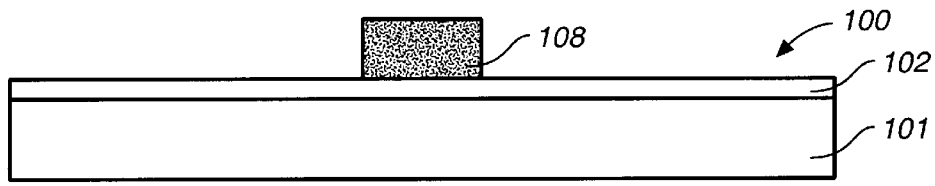
FIG._1B
(PRIOR ART)
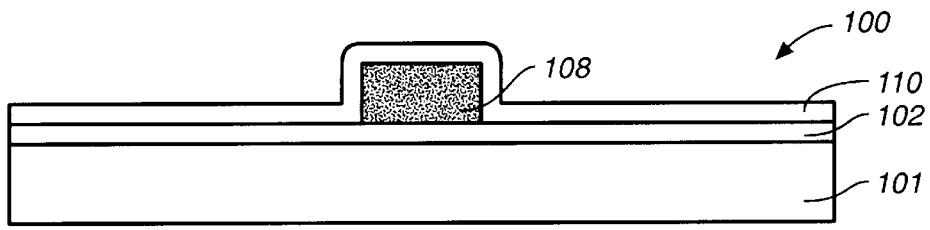
FIG._1C
(PRIOR ART)
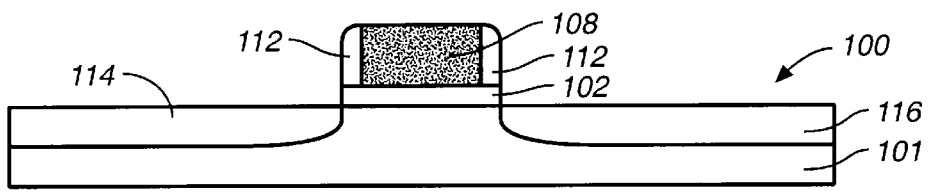
FIG._1D
(PRIOR ART)
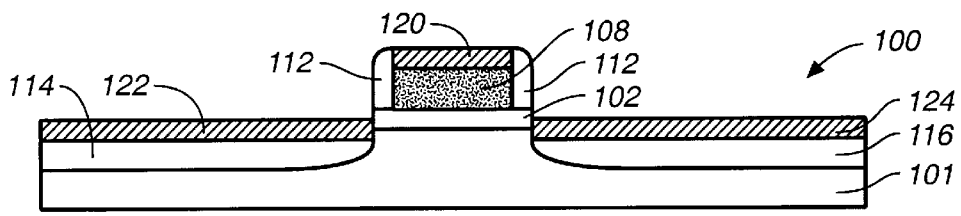
FIG._1E
(PRIOR ART)

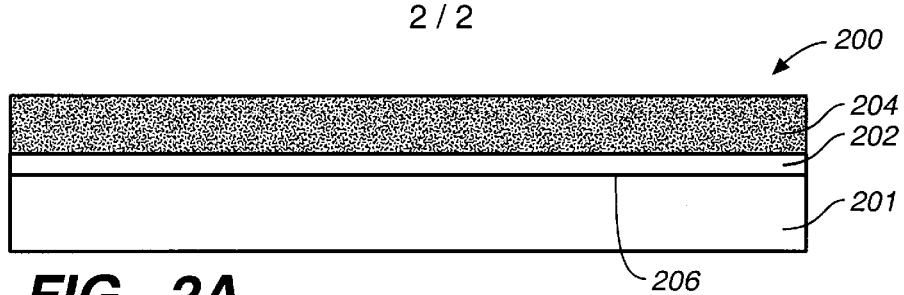
FIG._2A
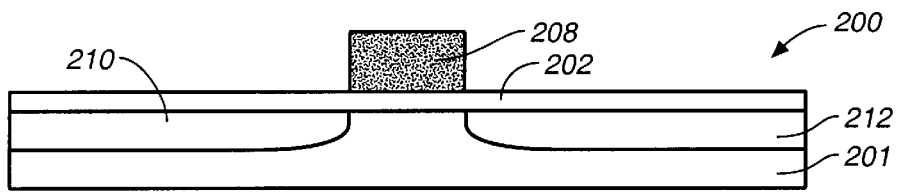
FIG._2B
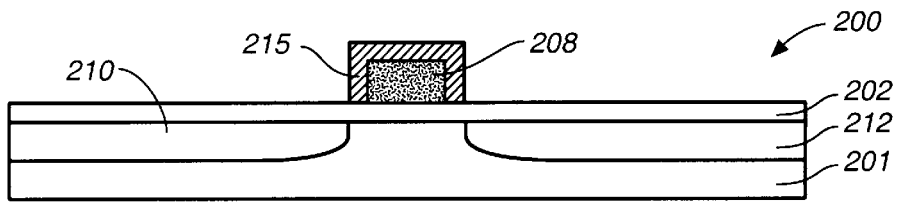
FIG._2C
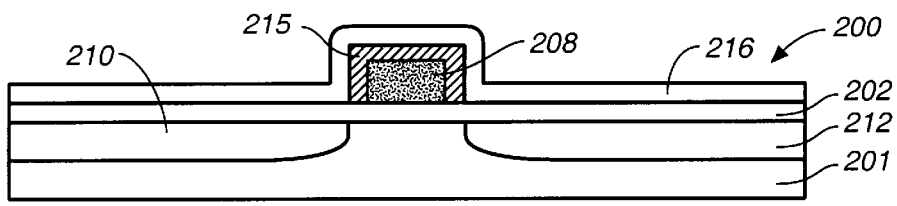
FIG._2D
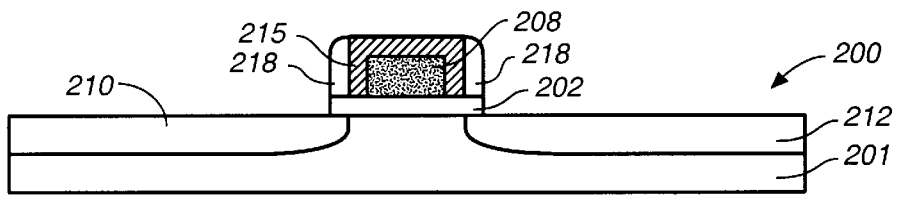
FIG._2E
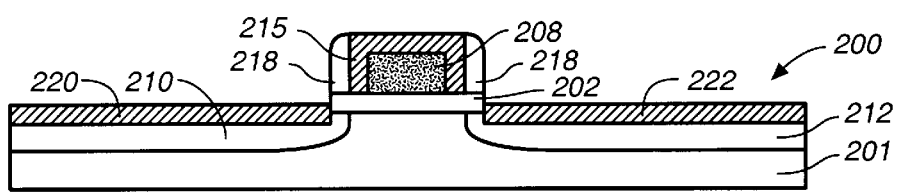
FIG._2F

METAL-ENCAPSULATED POLYSILICON GATE AND INTERCONNECT

BACKGROUND OF THE INVENTION

The present invention relates to the use of deposited metal to reduce device resistance and signal propagation delays in semiconductor devices. More particularly, the present invention relates to metal-encapsulated MOS transistor gates and interconnects.

Silicides, such as metal silicide ($WSi_2$), titanium silicide ($TiSi_2$), and cobalt silicide ($CoSi_2$) have been used in the semiconductor industry to enhance signal propagation through MOS transistors and other conductive features of semiconductor devices. A conventional silicide process produces a silicide region on the top of an MOS transistor's polysilicon ("poly") gate electrode and interconnect. The silicide has a lower resistance than the underlying doped silicon or poly. As a result, signal propagation through the transistor (gate and interconnect) is enhanced.

FIGS. 1A through 1E illustrate a conventional silicide process on a portion of a semiconductor wafer, such as is also described in S. Wolf, et al., *Silicon Processing for the VLSI Era*, vol.1, 397–399 (Lattice Press, 1986), which is incorporated by reference herein for all purposes. In FIG. 1A, a portion of a semiconductor wafer 100 having a semiconductor substrate 101 (typically monocrystalline silicon) is shown. The substrate 101 has gate oxide 102 and poly 104 layers generated successively on its upper surface 106. The gate oxide 102 and poly 104 layers are created in ways well known to those of skill in the art. For example, the gate oxide may be silicon dioxide ($SiO_2$) generated by thermal oxidation of surface 106 of the silicon substrate 101, and the poly 104 may be deposited on the gate oxide 102 by chemical vapor deposition. FIG. 1B shows the wafer 100 after the poly layer 104 has been patterned and etched to form a gate electrode 108 according to methods well known in the art (e.g., photolithography and plasma etching).

At this point, an ion implantation may be performed to form at least a portion of the source and drain regions. This implant is sometimes referred to as a lightly doped drain (LDD) implant and is self-aligned with polysilicon gate electrode 108.

Next, as shown in FIG. 1C, a layer of dielectric 110 is deposited on the wafer surface, covering both the gate oxide 102 and the gate electrode 108. The wafer is then subjected to an anisotropic etch which removes the dielectric 110 and gate oxide 102 on all exposed horizontal surfaces. The remaining dielectric 110 provides vertical spacers 112. It should be noted that the terms "horizontal" and "vertical" are used herein relatively and with reference to a major surface of a semiconductor wafer, and may be interchanged. The spacers 112 act as an ion implantation mask for subsequent ion implant procedures which are used to dope portions of the substrate 101 adjacent to the gate electrode 108 in order to create or complete (depending on whether an LDD implant was performed) source 114 and drain 116 regions, as shown in FIG. 1D. The spacers 112, together with the remaining gate oxide 102, separate the poly gate 108 from the source and drain regions.

As shown in FIG. 1E, after ion implantation, a refractory metal, such as titanium (Ti) is deposited on the wafer surface, and silicide layers 120, 122 and 124 are formed on the poly gate 108, source 114, and drain 116 regions, respectively, by reaction with the underlying poly/silicon by an alloy step well known in the art. Then, unreacted Ti is removed by a selective wet etch process, also well known in the art.

The conventional process of FIGS. 1A–1E results in the formation of silicide on the top surface but not the sidewalls of gate electrode. This is because sidewall spacers 112 protect the gate electrode sidewalls during silicide formation. This has the benefit of preventing the silicide layer from shorting the gate electrode to the source and drain regions. However, it has the disadvantage of providing only limited reductions in resistance. Until now, most processes did not require additional reductions in resistance. However, deep sub-micron device sizes require more significant reductions in resistance.

In order to achieve further reductions in resistance, various approaches have been proposed. In one approach, the silicide in a conventional process, such as that described above, is replaced with selectively deposited metal. V. V. Lee et al., *A selective CVD metal local interconnect technology*. IEEE Proceedings of the Int'l. Electron Devices Mtg. 1988 (IEDM 88), pp. 450–53. Alternatively, it has been proposed that the silicide layer extend down the sidewalls of the gate electrode. U.S. Pat. Nos. 5,227,320 and 5,306,951 present examples of such silicide "encapsulated" gate electrodes. To prevent shorting between the sidewall silicide and the source drain region, these designs allow the gate oxide to extend over the source and drain regions. Unfortunately, this precludes silicide formation on the source and drain regions.

As semiconductor device feature size is scaled below 0.25 $\mu$m, interconnect and gate delays becomes increasingly important. Accordingly, processes and apparatuses for further reducing device resistance and signal propagation delays are needed.

SUMMARY OF THE INVENTION

To achieve the foregoing, the present invention provides methods of forming a metal layer on the horizontal and vertical surfaces of a polysilicon gate electrode/interconnect in a MOS transistor, and devices having metal-encapsulated gates and interconnects. The metal encapsulation method of the present invention may also provide a layer of metal on the exposed surfaces of the source and drain regions of the transistor. The methods and apparatuses of the present invention allow further reductions in device resistance and signal propagation delays.

In one aspect, the invention provides a method of fabricating a semiconductor device. The method includes providing a partially-formed electronic device including a semiconductor substrate having a gate dielectric and gate electrode having horizontal and vertical surfaces formed thereon, and doped source and drain active regions on either side of the gate electrode, and selectively depositing a metal layer on the horizontal and vertical surfaces of the gate electrode. In addition, spacer dielectric regions disposed between portions of the metal-layered gate electrode and the doped source and drain active regions may be formed, so that the gate electrode is isolated from the metal-layered source and drain active regions. Then a second metal layer may be selectively deposited on exposed surfaces of the doped source and drain active regions. Metals that may be selectively deposited in accordance with the present invention include tungsten, aluminum, palladium and nickel.

In another aspect, the invention provides a semiconductor device. The device includes a semiconductor substrate having an electrically active surface, a gate dielectric region provided on a portion of the electrically active surface of the substrate, a gate electrode having a top surface and two sidewall surfaces provided on the dielectric region, and doped source and drain active regions separated at the substrate's electrically active surface by a channel region under the gate dielectric region. A metal layer is provided on the top surface and two sidewall surfaces of said gate electrode. In addition, the device may include spacer dielectric regions disposed between portions of the metal-layered gate electrode and the doped source and drain active regions, so that the spacer dielectric regions electrically isolate the gate electrode from the source and drain active regions, and a second metal layer on exposed surfaces of the doped source and drain active regions.

These and other features and advantages of the present invention are described below with reference to the drawings.

BRIEF DESCRIPTION OF THE DRAWINGS

FIGS. 1A–E depict cross-sectional views of a portion of a semiconductor wafer showing various stages in a conventional silicide process.

FIGS. 2A–F depict cross-sectional views of a portion of a semiconductor wafer showing various stages in a metal encapsulation process according to a preferred embodiment of the present invention.

DETAILED DESCRIPTION OF THE PREFERRED EMBODIMENTS

Reference will now be made in detail to preferred embodiments of the invention. Examples of the preferred embodiments are illustrated in the accompanying drawings. While the invention will be described in conjunction with these preferred embodiments, it will be understood that it is not intended to limit the invention to such preferred embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

The present invention provides methods of forming a metal layer on the exposed surfaces of a polysilicon gate electrode/interconnect in a MOS transistor, and devices having metal-encapsulated gates and interconnects. The metal encapsulation method of the present invention may also form a layer of metal on the exposed surfaces of the source and drain regions of the transistor. The methods and apparatuses of the present invention allow reductions in device resistance and signal propagation delays.

FIGS. 2A through 2G illustrate steps in the fabrication of a metal encapsulated MOS transistor according to a preferred embodiment of the present invention. In FIG. 2A, a portion of a semiconductor wafer 200 having a semiconductor substrate 201 (typically monocrystalline silicon) is shown. The substrate 201 has gate dielectric 202 and gate electrode 204 layers generated on its upper surface 206. The gate dielectric 202 and gate electrode 204 layers may be generated in ways well known to those of skill in the art. For example, the gate dielectric 202 may be silicon dioxide ($SiO_2$) grown by thermal oxidation of surface 206 of the silicon substrate 201 or deposited on the surface 206 by chemical vapor deposition (CVD). The gate electrode 204 may be polysilicon, for example, doped with n-type or p-type dopant atoms at about $10^{20}$ to $10^{21}$ cm$^{-3}$ deposited on the oxide to a thickness of about 1000 and 3000 Å by, for example, CVD.

FIG. 2B shows the wafer 200 after the poly gate electrode layer 204 has been patterned and etched to form a polysilicon gate 208 according to methods well known in the art. The gate length is dependent upon the current process technology. As this invention finds special application in deep sub-micron technologies, the length of gate electrode 208 is preferably no more than about 0.5 microns, more preferably no more than about 0.25 microns, and most preferably less than about 0.2 microns.

Ion implant procedures may be used to dope portions of the substrate 201 adjacent to the gate 208 in order to create source 210 and drain 212 regions. For example, the substrate 201 may be n- or p-doped at a concentration of about $10^{20}$ to $10^{21}$ cm$^{-3}$ to a depth of about 0.05 to 0.2 micrometers below the substrate 201 surface. The source 210 and drain 212 regions may be complete as formed by this implant or may be completed by another ion implant step at a subsequent stage of the fabrication according to procedures well known in the art. For example, a second source/drain implant step may be performed between the stages illustrated in FIGS. 2E and 2F wherein the spacers 218, in addition to the gate 208, may act as an ion implantation mask. It should be noted that the terms "source" and "drain" are used in a relative sense and may be interchanged.

Next, as shown in FIG. 2C, a layer of metal, for example, tungsten (W), aluminum (Al), Palladium (Pd), Nickel (Ni), or other selectively depositable metal, is selectively deposited on the exposed surfaces of the gate 208 (that is, all surfaces except the gate electrode 208/gate dielectric 202 interface). The deposition conditions are chosen such that metal is deposited only on the polysilicon gate electrode 208, and not on the adjacent gate oxide 202.

For example, the deposition of tungsten (W) may be conducted by, for example, by chemical vapor deposition (CVD) according to a process known in the art using the hydrogen or silane reduction of metal hexafluoride ($WF_6$), as described, for example, in V. V. Lee et al., *A selective CVD local tungsten interconnect technology*, IEEE IEDM 88, 4550–53 (1988), which is incorporated by reference herein for all purposes. Conditions for the selective deposition of Aluminum, Palladium, and Nickel are also known in the art, for example, T. Amazawa et al., *Selective growth of aluminum using a novel CVD system*, IEEE IEDM 88, 442–45 (1988), and C.S. Wei et al., The use of selective electroless metal deposition for micron size contact fill, IEEE IEDM 88, 446–49, both of which are incorporated by reference herein for all purposes. Under these deposition conditions, the metal deposits on exposed silicon/polysilicon, but not on oxide. The thickness of the deposited metal layer may be preferably about 200 to 1500 Å, more preferably about 400 to 800 Å, and most preferably about 600 Å.

The selective deposition of metal to enhance gate and interconnect conductivity has the advantage of depositing a conduction-enhancing low-resistivity material directly, in a single step, without requiring additional separate steps, for example, a silicide reaction step or a separate etch step to remove silicide from the gate oxide 202 regions adjacent to the gate electrode 208. In addition, compared to suicides, metals have a much lower resistivity, which further improves circuit performance by reducing propagation delays. Metals also sustain a higher thermal budget than suicides, and are more stable than most suicides.

In accordance with a preferred embodiment of the present invention, the source 210 and drain 212 regions of the transistor may also be coated with metal to improve their conductivity and that of the transistor as a whole. If the source 210 and drain 212 regions are to be coated with metal, it is important that the electrical isolation of the gate 208 from the source 210 and drain 212 be maintained, for example, by use of dielectric spacers. In this embodiment of the present invention, following the selective metal deposition described with reference to FIG. 2C, above, a spacer dielectric layer 216 is conformally deposited over the wafer surface, covering both the gate dielectric 202 and the metal-encapsulated gate electrode 208, as shown in FIG. 2D.

The spacer dielectric layer 216 is preferably about 500 to 1500 Å thick. The spacer dielectric layer 216 may be deposited in ways well known to those of skill in the art. For example, the spacer dielectric 202 may be deposited by CVD. The spacer dielectric 216 material preferably includes silicon dioxide (SiO$_2$) or silicon nitride (Si$_3$N$_4$). A preferred material for both the gate dielectric 202 and the spacer dielectric 216 is silicon dioxide.

Next, as shown in FIG. 2E, the spacer dielectric 216 on all exposed horizontal surfaces is then removed. This removal may be accomplished, for example, by an anisotropic etch performed under conditions well known in the art, such as described above with reference to FIG. 1D. The remaining spacer dielectric 216 provides vertical spacers 218. The spacers 218, together with the remaining gate oxide 202, separate the metal-encapsulated poly gate electrode 208 from the source 210 and drain 212 regions.

Then, as shown in FIG. 2F, a second selective metal deposition is performed over the top of the gate electrode 208 and the source 210 and drain 212 regions of the wafer 200. This second metal deposition may be conducted using the same parameters and conditions described above with reference to FIG. 2C.

It should be noted that the two-stage metal deposition process of this embodiment of the present invention provides the ability to apply metal to all three electrodes of a MOS transistor. As a result, resistivity in the transistor is decreased and propagation speeds are increased over previous designs. The method further provides the flexibility of being able to form different metal layers on different electrodes of a transistor. According to preferred embodiments of the invention, a first kind of metal, for example, tungsten, may be formed on the gate/interconnect of the transistor and a second kind, for example, aluminum, on the source and drain electrodes. Since different metals have somewhat different properties, including resistivity and thermal stability, this flexibility allows a semiconductor device designer to more precisely define the performance of a device by selection and placement of conduction-enhancing metals.

Although the foregoing invention has been described in some detail for purposes of clarity of understanding, it will be apparent that certain changes and modifications may be practiced within the scope of the appended claims. For example, metals other than those specifically identified herein which may be selectively deposited on silicon/polysilicon may be used in accordance with the present invention to achieve the advantages conferred by the present invention. Also, a plurality of selectively deposited metals may be layered over a silicon/polysilicon electrode in accordance with the present invention. Accordingly, the present embodiments are to be considered as illustrative and not restrictive, and the invention is not to be limited to the details given herein, but may be modified within the scope and equivalents of the appended claims.

What is claimed is:

1. A method of fabricating a semiconductor device, comprising:

providing a partially-formed electronic device including a semiconductor substrate having a gate dielectric and a gate electrode with horizontal and vertical surfaces formed thereon, and doped source and drain active regions on either side of said gate electrode;

selectively depositing a first metal layer on the horizontal and vertical surfaces of said gate electrode;

forming spacer dielectric regions disposed between portions of said first metal-layered gate electrode and said doped source and drain active regions, such that said gate electrode is isolated from said source and drain active regions; and selectively depositing a second metal layer on exposed surfaces of said doped source and drain active regions.

2. The method of claim 1, wherein said substrate comprises silicon, said gate dielectric comprises silicon dioxide, and said gate electrode comprises polysilicon.

3. The method of claim 1, wherein said step of forming spacer dielectric regions comprises:

forming a layer of spacer dielectric over said first metal-coated gate electrode, and gate dielectric; and removing spacer dielectric deposited on horizontal surfaces of said first metal-coated gate electrode and gate dielectric, so that vertical dielectric spacers remain on the vertical sidewall surfaces of said first metal-coated gate electrode.

4. The method of claim 1, wherein said first metal layer comprises at least one of tungsten, aluminum, palladium, and nickel.

5. The method of claim 1, wherein said first metal layer consists of tungsten.

6. The method of claim 1, wherein said selective deposition is done by chemical vapor deposition.

7. The method of claim 3, wherein said removal is done by anisotropic etching.

8. The method of claim 1, wherein said second metal layer comprises at least one of tungsten, aluminum, palladium, and nickel.

9. The method of claim 1, wherein said first and second metal layers comprise different metals.

10. The method of claim 1, wherein said second metal layer consists of aluminum.

11. The method of claim 1, wherein said first metal layer is about 200 to 1500 Å thick.

12. The method of claim 1, wherein said gate electrode has a length of no more than about 0.5 microns.

13. The method of claim 1, wherein said gate electrode has a length of no more than about 0.25 microns.

* * * * *